(12) United States Patent
Deng

(10) Patent No.: US 11,145,695 B2
(45) Date of Patent: Oct. 12, 2021

(54) DISPLAY SCREEN, MOBILE TERMINAL AND DISPLAY METHOD

(71) Applicant: VIVO MOBILE COMMUNICATION CO., LTD., Guangdong (CN)

(72) Inventor: Ziqiang Deng, Guangdong (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 0 days.

(21) Appl. No.: 16/651,471

(22) PCT Filed: Aug. 31, 2018

(86) PCT No.: PCT/CN2018/103564
§ 371 (c)(1),
(2) Date: Mar. 27, 2020

(87) PCT Pub. No.: WO2019/062471
PCT Pub. Date: Apr. 4, 2019

(65) Prior Publication Data
US 2020/0266245 A1 Aug. 20, 2020

(30) Foreign Application Priority Data
Sep. 28, 2017 (CN) .......................... 201710895986.7

(51) Int. Cl.
*G06F 3/038* (2013.01)
*H01L 27/32* (2006.01)
(Continued)

(52) U.S. Cl.
CPC .......... *H01L 27/323* (2013.01); *G06K 9/0004* (2013.01); *H04M 1/0266* (2013.01)

(58) Field of Classification Search
USPC .......................... 345/156, 211, 173, 174, 204
See application file for complete search history.

(56) References Cited

U.S. PATENT DOCUMENTS 10,410,076 B2 * 9/2019 Van Os ............... G06K 9/00255
10,621,409 B2 * 4/2020 Kim ..................... G06K 9/0004
(Continued)

FOREIGN PATENT DOCUMENTS

CN 105912168 A 8/2016
CN 106778707 A 5/2017
(Continued)

OTHER PUBLICATIONS

International Search Report and Written Opinion dated Apr. 9, 2020 issued in PCT/CN2018/103564.
(Continued)

*Primary Examiner* — Thuy N Pardo
(74) *Attorney, Agent, or Firm* — Gearhart Law LLC; David Postolski, Esq.

(57) ABSTRACT

A display screen, a mobile terminal and a display method are provided. The display screen includes an OLED display screen and an optical fingerprint module arranged in the OLED display screen. The OLED display screen includes a light-emitting layer and a touch screen. The light-emitting layer includes a first light-emitting region and a second light-emitting region. The first light-emitting region is arranged at a position corresponding to the optical fingerprint module and configured to, when the region of the touch screen, which corresponds to the first light-emitting region, is not touched, emit light at a first preset brightness value, and when the region of the touch screen, which corresponds to the first light-emitting region, is touched, emit light at a second preset brightness value, the first preset brightness value is smaller than the second preset brightness value.

16 Claims, 4 Drawing Sheets

(51) Int. Cl.
*G06K 9/00* (2006.01)
*H04M 1/02* (2006.01)

(56) References Cited

U.S. PATENT DOCUMENTS

| | | | |
|---|---|---|---|
| 10,905,399 B2* | 2/2021 | Lee | A61B 8/481 |
| 10,935,421 B2* | 3/2021 | Pang | G01J 1/0233 |
| 2012/0019500 A1* | 1/2012 | Hwang | G09G 3/325 |
| | | | 345/211 |
| 2014/0218327 A1 | 8/2014 | Shi et al. | |
| 2015/0002490 A1* | 1/2015 | Han | A61B 8/462 |
| | | | 345/204 |
| 2017/0071571 A1* | 3/2017 | Lee | A61B 8/14 |
| 2017/0103252 A1* | 4/2017 | Li | G06K 9/00033 |
| 2017/0215838 A1* | 8/2017 | Park | A61B 8/463 |
| 2017/0220838 A1 | 8/2017 | He et al. | |
| 2017/0323140 A1* | 11/2017 | Huang | G06K 9/0004 |
| 2018/0157395 A1* | 6/2018 | Mhun | G06F 3/04812 |
| 2018/0306640 A1* | 10/2018 | Pang | G06K 9/0004 |
| 2018/0314874 A1 | 11/2018 | Yang et al. | |
| 2019/0080189 A1* | 3/2019 | Van Os | H04W 12/06 |
| 2020/0000434 A1* | 1/2020 | Lee | A61B 8/0808 |
| 2020/0110918 A1 | 4/2020 | Zhang | |
| 2020/0202106 A1* | 6/2020 | Kim | G06K 9/0012 |
| 2021/0042549 A1* | 2/2021 | Van Os | G06K 9/22 |

FOREIGN PATENT DOCUMENTS

| | | |
|---|---|---|
| CN | 107004130 A | 8/2017 |
| CN | 107168469 A | 9/2017 |
| CN | 107194324 A | 9/2017 |
| CN | 107819011 A | 3/2018 |

OTHER PUBLICATIONS

Office Action dated Aug. 23, 2019 issued in Chinese Application No. 201710895986.7.

* cited by examiner

DISPLAY SCREEN, MOBILE TERMINAL AND DISPLAY METHOD

CROSS-REFERENCE TO RELATED APPLICATION

The present application is the U.S. national phase of PCT Application No. PCT/CN2018/103564 filed on Aug. 31, 2018, which claims a priority of the Chinese patent application No. 201710895986.7 filed on Sep. 28, 2017, which is incorporated herein by reference in its entirety.

TECHNICAL FIELD

Embodiments of the present disclosure relate to the field of communication technology, in particular to a display screen, a mobile terminal and a display method.

BACKGROUND

Along with the rapid development of mobile terminals, mobile terminals have become an indispensable tool and brought great convenience for our lives. Compared with the mobile terminal with a small ratio of screen-to-body, the mobile terminal with a large ratio of screen-to-body provides excellent user experience, hence, there is such a trend toward to increase the ratio of screen-to-body. In the related art, a fingerprint identification module is arranged right below a display screen. However, by using the fingerprint identification module to identify fingerprints, the success rate of fingerprints identification is low, due to a relatively low brightness value of the display screen.

SUMMARY

In one aspect, the present disclosure provides in some embodiments a display screen, including an Organic Light-Emitting Diode (OLED) display screen and an optical fingerprint module arranged in the OLED display screen. The OLED display screen includes a light-emitting layer and a touch screen. The light-emitting layer includes a first light-emitting region and a second light-emitting region. The first light-emitting region is arranged at a position corresponding to the optical fingerprint module and is configured to emit light at a first preset brightness value, when the region of the touch screen, which corresponds to the first light-emitting region, is not touched. When the region of the touch screen, which corresponds to the first light-emitting region, is touched, the first light-emitting region emits light at a second preset brightness value, which is larger than the first preset brightness value.

In another aspect, the present disclosure provides in some embodiments of a mobile terminal including the above-mentioned display screen.

In yet another aspect, the present disclosure provides in some embodiments of a display method for the above-mentioned mobile terminal, including, when it is detected that the touch screen is touched and skin patterns on the touch screen have been detected by the optical fingerprint module, controlling the first light-emitting region emits light at the second preset brightness value.

In still another aspect, the present disclosure provides in some embodiments a mobile terminal, including a memory, a processor, and a computer program stored in the memory and executed by the processor. The processor is configured to execute the computer program so as to implement the steps of the above-mentioned display method.

In still yet another aspect, the present disclosure provides in some embodiments a computer-readable storage medium storing in a computer program. The computer program is executed by a processor so as to implement the steps of the above-mentioned display method.

BRIEF DESCRIPTION OF THE DRAWINGS

In order to clearly illustrate the technical solutions of the present disclosure or the related art in a clearer manner, the drawings of the present disclosure or the related art will be described in the following briefly. Obviously, the following drawings merely relate to some embodiments of the present disclosure, and based on these drawings, a person skilled in the art may obtain the other drawings without any creative effort.

DETAILED DESCRIPTION

In order to make objects, the technical solutions and the advantages of the present disclosure more apparent, the present disclosure will be described hereinafter in a clear and complete manner in connection with the drawings and embodiments. Obviously, the following embodiments merely relate to a part of, rather than all of, the embodiments of the present disclosure, and based on these embodiments, a person skilled in the art without any creative effort, can obtain the other embodiments, which also fall within the scope of the present disclosure.

Figure 1:
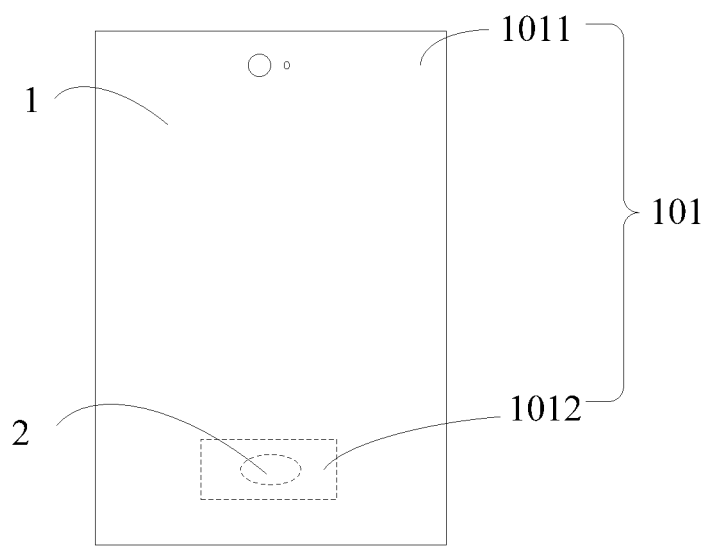
FIG. 1 is a schematic view of a display screen according to one embodiment of the present disclosure.

As shown in FIG. 1, the present disclosure provides in some embodiments of a display screen, which includes an OLED display screen 1 and an optical fingerprint module 2 arranged in the OLED display screen 1. The OLED display screen 1 may include a light-emitting layer 101 and a touch screen. The light-emitting layer may include a first light-emitting region 1011 and a second light-emitting region 1012. The first light-emitting region 1011 may be arranged at a position corresponding to the optical fingerprint module 2 and configured to emit light at a first preset brightness value, when the region of the touch screen, which corresponds to the first light-emitting region, is not touched. When the region of the touch screen, corresponding to the first light-emitting region 1011, is touched, the first light-emitting region 1011 emits light at a second preset brightness value. The first preset brightness value is smaller than the second preset brightness value.

The OLED display screen 1 may include the light-emitting layer 101 and the touch screen 102. An area about a cross section of the light-emitting layer 101 may equal to, or slightly greater than, an area about a cross section of the touch screen 102, so as to ensure each portion of the touch screen 102 can be irradiated by the light from the light-emitting layer.

Each portion of the light-emitting layer 101 may emit light at a same brightness value, or emit light at brightness values having a difference within a certain range, so as to provide the light of the touch screen with a homogeneous brightness value as viewed by user's eyes. For example, the difference among the brightness values may be within 0.00001 to 0.000001 nit. To be clarified, nit is a luminance unit.

The first light-emitting region 1011 and the second light-emitting region 1012, including their positions and areas, may have been designed just at the beginning of the design of the display screen.

The touch screen may be pressed by a body part of the user having skin patterns, such as a finger. It should be noted that, the touch screen 102 may be pressed by the user's finger, because the optical fingerprint module 2 in the OLED display screen 1 is specially used to identify the fingerprint.

Herein, specific values of the first preset brightness value and the second preset brightness value will not be particularly defined, as long as the first preset brightness value is smaller than the second preset brightness value.

Two separate circuits may be provided to supply power to the first light-emitting region 1011 and the second light-emitting region 1012, respectively. For example, the power may be supplied to the first light-emitting region 1011 through two electric wires, i.e., a first electric wire and a second electric wire. The first electric wire is configured to provide an Emissive Layer Voltage Device Device (ELVDD) to the first light-emitting region, and the second electric wire is configured to provide an Emissive Layer Voltage Series Series (ELVSS) to the first light-emitting region 1011. In addition, the power may be supplied to the second light-emitting region 1012 through two electric wires, i.e., a third electric wire and a fourth electric wire. The third electric wire is configured to supply the ELVDD to the second light-emitting region the 1012, and the fourth electric wire is configured to supply ELVSS to the second light-emitting region 1012. When the touch screen 102 is not touched, the first electric wire and the third electric wire may each provide a voltage of 4.6V, and the second electric wire and the fourth electric wire may each provide a voltage of 2.6V. Under the effect of the above voltages, the first light-emitting region 1011 and the second light-emitting region 1012 may each emit the light at 430 nit, i.e., the first preset brightness value. When the touch screen 102 is touched, the first electric wire may provide a voltage of 5.5V and the second electric wire may provide a voltage of 3.0V, so as to enable the first light-emitting region 1011 to emit the light at 600 nit, i.e., the second preset brightness value. Based on the above configuration, it is able to increase the brightness value of the first light-emitting region 1011 when the touch screen 102 is touched, and enable the optical fingerprint module 2 to identify the skin patterns, e.g., the fingerprint improves a fingerprint identification success rate of the display screen in a more accurate manner.

Different voltages may be provided when a processor of a mobile terminal is reading information at different regions of the touch screen 102. For example, an ELVDD of 4.6V and an ELVSS of 2.8V may be provided when the processor is reading information on the touch screen 102 at a position corresponding to the second light-emitting region 1012, and an ELVDD of 5.5V and an ELVSS of 3.0V may be provided when the processor is reading information on the touch screen 102 at a position corresponding to the first light-emitting region 1011. Based on the above configuration, it is also able to increase the brightness value of the first light-emitting region 1011, and enable the optical fingerprint module 2 to identify the skin patterns, e.g., the fingerprint, in a more accurate manner, thereby to improve the fingerprint identification success rate of the display screen.

Figure 2:
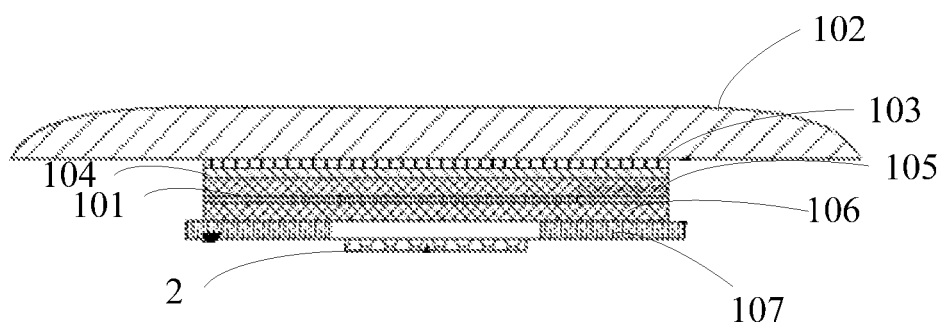
FIG. 2 is another schematic view of the display screen according to one embodiment of the present disclosure.

As shown in FIG. 2, the OLED display screen 1 may include the touch screen 102, a transparent adhesive layer 103, a polarizer 104, an upper glass substrate 105, the light-emitting layer 101, a lower glass substrate 106, and a protection foam layer 107. The polarizer 104 is attached to the touch screen 102 by the transparent adhesive layer 103. The polarizer 104 is configured to change a transmission direction of the light, so as to increase a transmittance and decrease a reflectance. Thereby, the entire display screen presents better display effects. In addition, the light-emitting layer 101 may be arranged between the upper glass substrate 105 and the lower glass substrate 106, in order to facilitate the transmission of the light from the light-emitting layer 101. The protection foam layer 107 is configured to protect the optical fingerprint module 2. The optical fingerprint module 2 may be arranged at a same layer as, or arranged below, the protection foam layer 107, so as to be protected by the protection foam layer.

According to the embodiments of the present disclosure, the display screen may include the display screen and the optical fingerprint module arranged in the OLED display screen. The OLED display screen may include the light-emitting layer and the touch screen. The light-emitting layer may include the first light-emitting region and the second light-emitting region. The first light-emitting region may be arranged at a position corresponding to the optical fingerprint module and configured to, emit light at a first preset brightness value, when the region of the touch screen, which corresponds to the first light-emitting region, is not touched. When the region of the touch screen, which corresponds to the first light-emitting region, is touched, the first light-emitting region emits light at a second preset brightness value, which is larger than the first preset brightness value. When it is detected that the region of the touch screen, which corresponds to the second light-emitting region, is touched, the brightness value of the second light-emitting region may be changed from the first preset brightness value to the second preset brightness value. As a result, it is able to increase the brightness value of the second light-emitting region. Furthermore, there is an improvement of the fingerprint identification success rate of the display screen.

In a possible embodiment of the present disclosure, the range of a screen-to-body ratio of the OLED display screen 1 is 85% to 93%.

When the screen-to-body ratio of the OLED display screen 1 is 85% or 93%, it is able for the first light-emitting region 1011 to emit light at the first preset brightness value when the region of the touch screen 102, which corresponds to the first light-emitting region 1011, is not touched. And the first light-emitting region 1011 emits light at the second preset brightness value when the region of the touch screen 102, which corresponds to the first light-emitting region 1011, is touched.

In the embodiments of the present disclosure, through the OLED display screen having the screen-to-body ratio of 85% to 93%, the first light-emitting region may emit light at the first preset brightness value when the region of the touch screen 102, which corresponds to the first light-emitting region 1011, is not touched. And the first light-emitting region emits light at the second preset brightness value when the region of the touch screen 102, which corresponds to the first light-emitting region 1011, is touched. In addition, it is able for the OLED display screen having the screen-to-body ratio of 85% to 93% to improve the above effect more obviously.

In a possible embodiment of the present disclosure, the second light-emitting region 1012 is configured to emit light at the first predetermined brightness value, both when the region of the touch screen 102, which corresponds to the first light-emitting region 1011, is not touched, and when the region of the touch screen 102, which corresponds to the first light-emitting region 1011, is touched.

In the embodiments of the present disclosure, the second light-emitting region is configured to emit light at the first preset brightness value all the time, so as to ensure that the region of the touch screen, which corresponds to the second light-emitting region 1011, has a constant brightness value. Hence, such a configuration can facilitate the reading of the information on the touch screen at the position corresponding to the second light-emitting region, and prolongs a service life of the display screen.

In a possible embodiment of the present disclosure, the first preset brightness value may be greater than or equal to 600 nit.

In the embodiments of the present disclosure, when the first preset brightness value is greater than or equal to 600 nit, it is able to further improve the fingerprint identification success rate of the optical fingerprint module, and also improve the fingerprint identification success rate of the display screen.

In a possible embodiment of the present disclosure, the second preset brightness value may be 0.2 to 430 nit.

In the embodiments of the present disclosure, when the second preset brightness value is 0.2 to 430 nit, it is able to prolong the service life of the display screen and promote the controllability of the display screen.

In a possible embodiment of the present disclosure, the optical fingerprint module 2 may be arranged in the OLED display screen 1 through an adhesive.

In the embodiments of the present disclosure, when the optical fingerprint module is arranged in the OLED display screen through the adhesive, it is able to fix the optical fingerprint module in a better manner. In addition, when a fault occurs for the optical fingerprint module, it is able to facilitate the disassembly of the optical fingerprint module, thereby to facilitate the maintenance of the display screen.

The present disclosure further provides in some embodiments of a mobile terminal including the above-mentioned display screen.

The mobile terminal may be a mobile phone, a tablet personal computer, a laptop computer, a Personal Digital Assistant (PDA), a Mobile Internet Device (MID), or a wearable device.

According to the mobile terminal including the display screen in the embodiments of the present disclosure, when the region of the touch screen, which corresponds to the second light-emitting region, is touched, the brightness value of the second light-emitting region may be changed from the first preset brightness value to the second preset brightness value. As a result, it is able to not only increase the brightness value of the second light-emitting region, but also improve the fingerprint identification success rate of the display screen.

Figure 3:
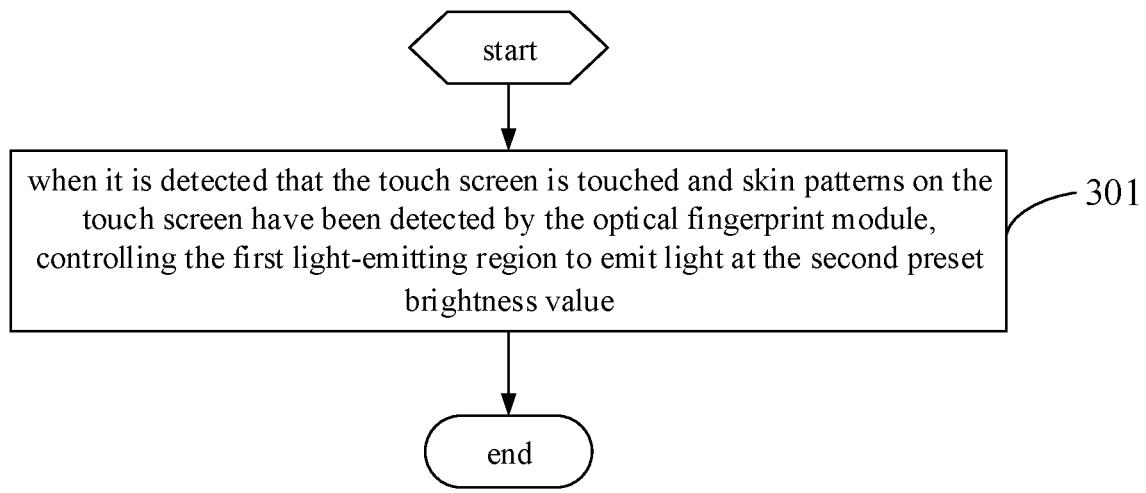
FIG. 3 is a flow chart of a display method according to one embodiment of the present disclosure.

As shown in FIG. 3, the present disclosure further provides in some embodiments a display method for the above-mentioned mobile terminal, which includes Step 301 of, when it is detected that the touch screen is touched and skin patterns on the touch screen have been detected by the optical fingerprint module, controlling the first light-emitting region to emit light at the second preset brightness value.

According to the embodiments of the present disclosure, when it is detected that the touch screen is touched and the skin patterns on the touch screen have been detected by the optical fingerprint module, the first light-emitting region may be controlled to emit light at the second preset brightness value. When the first light-emitting region emits light at the second preset brightness value, it is able to improve the fingerprint identification success rate of the optical fingerprint module.

In a possible embodiment of the present disclosure, subsequent to Step 301, the display method may further include controlling the second light-emitting region to emit light at the first predetermined brightness value.

In the embodiments of the present disclosure, the second light-emitting region may be controlled to emit light at the first preset brightness value when the first light-emitting region is controlled to emit light at the second preset brightness value, so as to enable the entire display screen to display at the constant brightness values, which improves the user experience. In addition, it is able to prevent the second light-emitting region from emitting light at the second preset brightness value, thereby to reduce the power consumption for the entire display screen.

Figure 4:
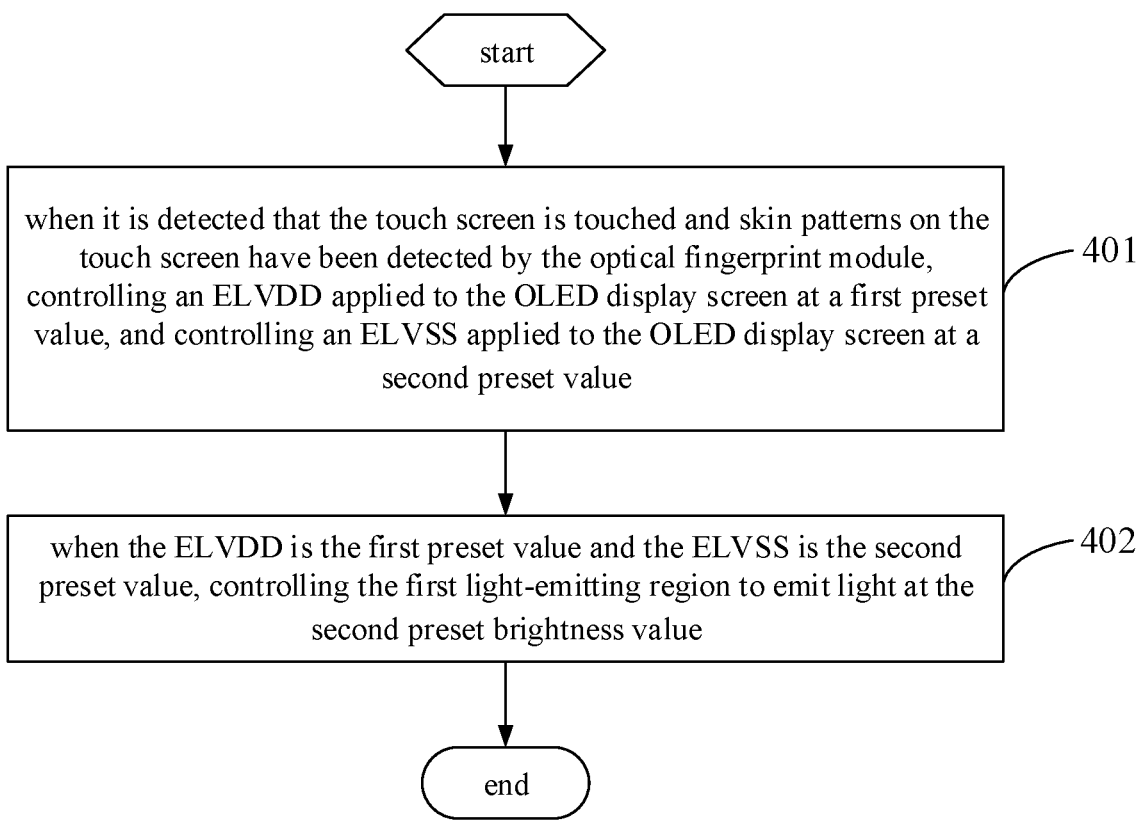
FIG. 4 is another flow chart of the display method according to one embodiment of the present disclosure.

As shown in FIG. 4, the present disclosure further provides in some embodiments a display method for the above-mentioned mobile terminal, which includes: Step 401 of, when it is detected that the touch screen is touched and skin patterns on the touch screen have been detected by the optical fingerprint module, controlling an ELVDD applied to the OLED display screen at a first preset value, and controlling an ELVSS applied to the OLED display screen at a second preset value; and Step 402 of, when the ELVDD is the first preset value and the ELVSS is the second preset value, controlling the first light-emitting region to emit light at the second preset brightness value.

Prior to Step 401, considering the service life and the stability of the mobile terminal, usually the ELVDD applied to the entire OLED display screen may be controlled to be smaller than a first threshold, and the ELVSS may be controlled to be smaller than a second threshold. The first threshold may be smaller than the first preset value, and the second threshold may be smaller than the second preset value. When the second light-emitting region needs to emit light at the second preset brightness value, it is necessary to control the ELVDD applied to the entire OLED display screen to be the first preset value and control the ELVSS applied to the entire OLED display screen to be the second preset value. It should be noted that, specific values of the first preset value and the second preset value will not be particularly defined herein.

In the embodiments of the present disclosure, through the above settings, when the ELVDD applied to the entire OLED display screen is the first preset value and the ELVSS applied to the entire OLED display screen is the second preset value, the first light-emitting region may be controlled to emit light at the second preset brightness value. As a result, it is able to achieve functions of the display screen in a better manner, and prolong the service life of the entire display screen.

Figure 5:
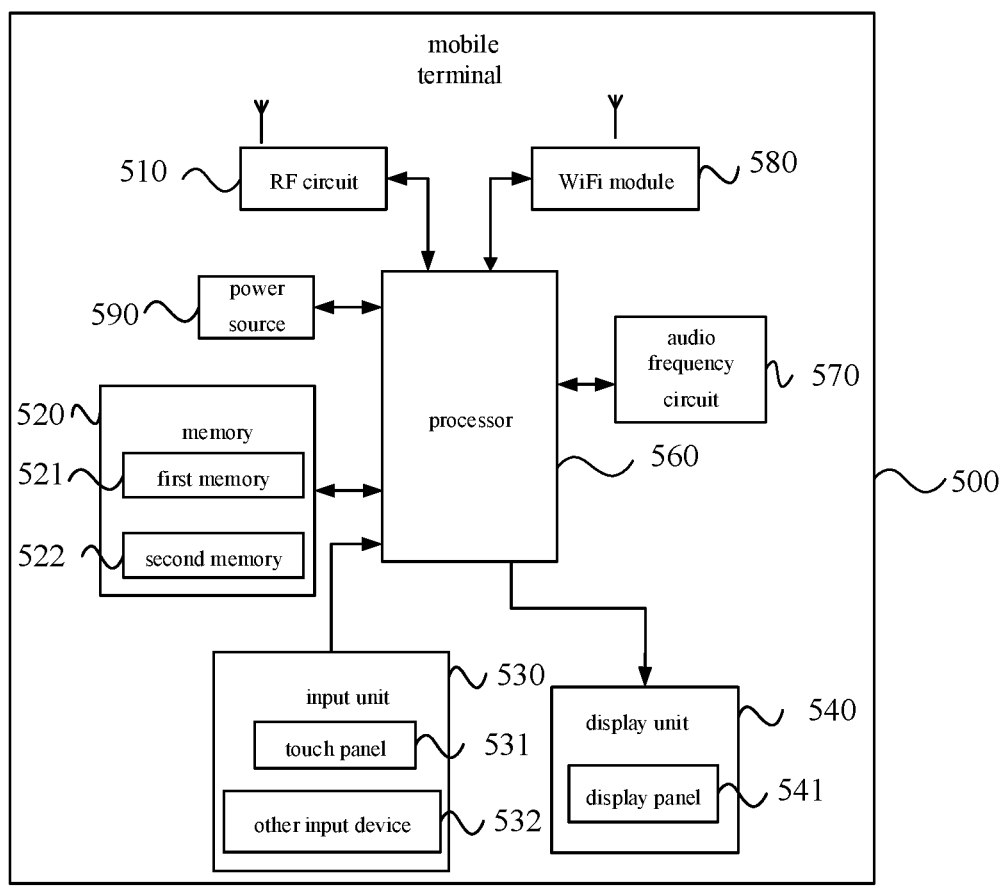
FIG. 5 is a block diagram of a mobile terminal according to one embodiment of the present disclosure.

As shown in FIG. 5, the present disclosure further provides in some embodiments a mobile terminal 500 which includes a Radio Frequency (RF) circuit 510, a memory 520, an input unit 530, a display unit 540, a processor 560, an audio frequency circuit 570, a Wireless Fidelity (WiFi) module 580 and a power source 590.

The input unit 530 is configured to receive digital or character information inputted by the user, and generate a signal input related to user settings and function control of the mobile terminal 500. To be specific, the input unit 530 may include a touch panel 531. The touch panel 531, also called as touch screen, is configured to collect a touch operation made by the user on or in proximity to the touch screen (e.g., an operation made by the user through any appropriate object or attachment (e.g., finger or stylus) on or in the proximity to the touch panel 531), and drive a corresponding connection device in accordance with a predetermined program. In a possible embodiment of the present disclosure, the touch panel 531 may include a touch detection unit and a touch controller. The touch detection unit is configured to detect a touch position and a signal generated due to the touch operation, and transmit the signal to the touch controller. The touch controller is configured to receive touch information from the touch detection unit, convert it into coordinates of a touch point, transmit the coordinates to the processor 560, and receive and execute a command from the processor 560. In addition, the touch panel 531 may be of a resistive type, a capacitive type, an infrared type or a surface acoustic wave (SAW) type. The input unit 530 may further include an input device 532 which includes, but not limited to, a physical keyboard, a functional button (e.g., a volume control button or an on/off button), a trackball, a mouse, and a joystick.

The display unit 540 is configured to display information inputted by the user or information to be presented to the user, and various interfaces for the mobile terminal 500, and it may include a display panel 541. In a possible embodiment of the present disclosure, the display screen 1441 may be a Liquid Crystal Display (LCD) screen or an OLED screen.

It should be appreciated that, the touch panel 531 may cover the display panel 541, so as to form a touch display screen. When the touch operation made on or in proximity to the touch display screen has been detected, the touch information may be transmitted to the processor 560 so as to determine a type of a touch event. Then, the processor 560 may provide corresponding visual output on the touch display screen in accordance with the type of the touch event.

The touch display screen may include an application interface display region and a commonly-used controls display region. An arrangement mode of the two display regions will not be particularly defined herein, e.g., one of the two display regions may be arranged above or under the other, or arranged to the left or the right of the other. The application interface display region may be adopted to display interfaces for applications, and each interface may include an icon for at least one application and/or an interface element such as Widget desktop control. The application interface display region may also be a blank interface where no content is contained. The commonly-used controls display region may be adopted to display controls which are used frequently, e.g., setting button, interface number, scroll bar, or such application icons as telephone book icon.

The processor 560 may be a control center of the mobile terminal 500, and connected to each member of the entire mobile terminal via various interfaces and lines. The processor 560 is configured to run or execute software programs and/or modules stored in a first memory 521, and call data stored in a second memory 522, so as to achieve various functions of the mobile terminal 500 and process the data, thereby to monitor the mobile terminal 500. In a possible embodiment of the present disclosure, the processor 560 may include one or more processing units.

The mobile terminal 500 may include a display screen, and the display screen may include an OLED display screen and an optical fingerprint module arranged in the OLED display screen. The display screen may include a light-emitting layer and a touch screen.

In a possible embodiment of the present disclosure, through calling software programs and/or modules stored in the first memory 521 and/or data stored in the second memory 522, the processor 560 is configured to, when it is detected that the touch screen is touched and skin lines on the touch screen have been detected by the optical fingerprint module, control the first light-emitting region to emit light at the second predetermined brightness value.

The processor 560 is further configured to: when it is detected that the touch screen is touched and the skin patterns on the touch screen has been detected by the optical fingerprint module, control an ELVDD applied to the OLED display screen to be a first preset value, and control an ELVSS applied to the OLED display screen to be a second preset value; and when the ELVDD is the first preset value and the ELVSS is the second preset value, control the first light-emitting region to emit light at the second preset brightness value.

The processor 560 is further configured to control the second light-emitting region to emit light at the first preset brightness value.

The mobile terminal in the embodiments of the present disclosure may be a mobile terminal, a tablet personal computer, a PDA, or a vehicle-mounted computer.

The implementation of the mobile terminal 500 may refer to that mentioned hereinabove, and thus will not be particularly defined herein.

According to the mobile terminal 500 in the embodiments of the present disclosure, through the above settings, when the ELVDD applied to the entire OLED display screen is the first preset value and the ELVSS applied to the entire OLED display screen is the second preset value, the first light-emitting region may be controlled to emit light at the second preset brightness value. As a result, it is able to achieve functions of the display screen in a better manner, and prolong the service life of the entire display screen.

The present disclosure further provides in some embodiments a computer-readable storage medium storing therein a computer program. The computer program is executed by a processor so as to, when it is detected that the touch screen is touched and skin lines on the touch screen have been detected by the optical fingerprint module, control the first light-emitting region to emit light at the second predetermined brightness value.

It should be noted that, when the computer program is executed by the processor, it is able to achieve the above-mentioned functions, which will thus not be particularly defined herein.

It should be noted that, units and steps described in the embodiments of the present disclosure may be implemented in the form of electronic hardware, or a combination of a computer program and the electronic hardware. Whether or not these functions are executed by hardware or software depends on specific applications or design constraints of the technical solution. Different methods may be adopted with respect to the specific applications so as to achieve the described functions, without departing from the scope of the present disclosure.

It should be further noted that, for convenience and clarification, operation procedures of the system, device and units described hereinabove may refer to the corresponding procedures in the method embodiment, and thus will not be particularly defined herein.

It should be further noted that, the device and method may be implemented in any other ways. For example, the embodiments for the apparatus is merely for illustrative purposes, and the modules or units are provided merely on the basis of their logic functions. During the actual application, some modules or units may be combined together or integrated into another system. Alternatively, some functions of the module or units may be omitted or not executed. In addition, the coupling connection, direct coupling connection or communication connection between the modules or units may be implemented via interfaces, and the indirect coupling connection or communication connection between the modules or units may be implemented in an electrical or mechanical form or in any other form.

The units may be, or may not be, physically separated from each other. The units for displaying may be, or may not be, physical units, i.e., they may be arranged at an identical position, or distributed on a plurality of network elements. Parts or all of the units may be selected in accordance with the practical need, so as to achieve the purpose of the present disclosure.

In addition, the functional units in the embodiments of the present disclosure may be integrated into a processing unit, or the functional units may exist independently, or two or more functional units may be combined together.

In the case that the functional units are implemented in a software form and sold or used as a separate product, they may be stored in a computer-readable medium. Based on this, the technical solutions of the present disclosure, partial or full, or parts of the technical solutions of the present disclosure contributing to the related art, may appear in the form of software products, which may be stored in a storage medium and include several instructions so as to enable computer equipment (a personal computer, a server or network equipment) to execute all or parts of the steps of the method according to the embodiments of the present disclosure. The storage medium includes any medium capable of storing therein program codes, e.g., a universal serial bus (USB) flash disk, a mobile hard disk (HD), a read-only memory (ROM), a random access memory (RAM), a magnetic disk or an optical disk.

It should be further noted that, all or parts of steps in the above method may be implemented through relevant hardware under the control of the computer program. The computer program may be stored in a computer-readable storage medium. When the computer program is executed, it is able to implement of the steps of the method. The storage medium may be a magnetic disc, an optical disc, an ROM or an RAM.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display screen, comprising an Organic Light-Emitting Diode (OLED) display screen and an optical fingerprint module arranged in the OLED display screen, wherein the OLED display screen comprises a light-emitting layer and a touch screen, the light-emitting layer comprises a first light-emitting region and a second light-emitting region, and the first light-emitting region is arranged at a position corresponding to the optical fingerprint module and configured to, when the region of the touch screen, which corresponds to the first light-emitting region, is not touched, emit light at a first preset brightness value, and when the region of the touch screen, which corresponds to the first light-emitting region, is touched, emit light at a second preset brightness value, the first preset brightness value is smaller than the second preset brightness value.

2. The display screen according to claim 1, wherein the second light-emitting region is configured to, when the region of the touch screen, which corresponds to the first light-emitting region, is not touched and when the region of the touch screen, which corresponds to the first light-emitting region, is touched, emit light at the first preset brightness value.

3. The display screen according to claim 2, wherein the first preset brightness value is greater than or equal to 600 nit.

4. The display screen according to claim 3, wherein the second preset brightness value is 0.2 to 430 nit.

5. The display screen according to claim 4, wherein the optical fingerprint module is arranged in the OLED display screen through an adhesive.

6. A mobile terminal, comprising the display screen according to claim 1.

7. A display method for the mobile terminal according to claim 6, comprising:
controlling, when it is detected that the touch screen is touched and skin patterns on the touch screen have been detected by the optical fingerprint module, the first light-emitting region to emit light at the second preset brightness value.

8. The display method according to claim 7, wherein the controlling, when it is detected that the touch screen is touched and the skin patterns on the touch screen have been detected by the optical fingerprint module, the first light-emitting region to emit light at the second preset brightness value comprises:
controlling, when it is detected that the touch screen is touched and the skin patterns on the touch screen have been detected by the optical fingerprint module, an Emissive Layer Voltage Device Device (ELVDD) applied to the OLED display screen to be a first preset value, and an Emissive Layer Voltage Series Series (ELVSS) applied to the OLED display screen to be a second preset value; and
controlling, when the ELVDD is the first preset value and the ELVSS is the second preset value, the first light-emitting region to emit light at the second preset brightness value.

9. The display method according to claim 7, wherein subsequent to controlling the first light-emitting region to emit light at the second preset brightness value, the display method further comprises:
controlling the second light-emitting region to emit light at the first preset brightness value.

10. A mobile terminal, comprising a memory, a processor, and a computer program stored in the memory and executed by the processor, wherein the processor is configured to execute the computer program so as to implement the display method according to claim 7.

11. A computer-readable storage medium storing therein a computer program, wherein the computer program is executed by a processor so as to implement the steps of the display method according to claim 7.

12. The mobile terminal according to claim 6, wherein the second light-emitting region is configured to, when the region of the touch screen, which corresponds to the first light-emitting region, is not touched and when the region of the touch screen, which corresponds to the first light-emitting region, is touched, emit light at the first preset brightness value.

13. The mobile terminal according to claim 12, wherein the first preset brightness value is greater than or equal to 600 nit.

14. The mobile terminal according to claim 13, wherein the second preset brightness value is 0.2 to 430 nit.

15. The mobile terminal according to claim 14, wherein the optical fingerprint module is arranged in the OLED display screen through an adhesive.

16. The display method according to claim 8, wherein subsequent to controlling the first light-emitting region to emit light at the second preset brightness value, the display method further comprises:

controlling the second light-emitting region to emit light at the first preset brightness value.

* * * * *